United States Patent
Onoue et al.

(10) Patent No.: US 12,527,206 B2
(45) Date of Patent: Jan. 13, 2026

(54) PROTECTIVE LAYER FOR DISPLAY MODULE AND MANUFACTURING METHOD THEREFOR

(71) Applicant: SAMSUNG DISPLAY CO., LTD., Yongin-si (KR)

(72) Inventors: Shinya Onoue, Hwaseong-si (KR); Jaekyun Lee, Gwangju (KR); Dongjin Jeong, Seoul (KR); Yunjeong Cho, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 720 days.

(21) Appl. No.: 17/785,975

(22) PCT Filed: Nov. 18, 2020

(86) PCT No.: PCT/KR2020/016243
§ 371 (c)(1),
(2) Date: Jun. 16, 2022

(87) PCT Pub. No.: WO2021/145549
PCT Pub. Date: Jul. 22, 2021

(65) Prior Publication Data
US 2023/0116734 A1    Apr. 13, 2023

(30) Foreign Application Priority Data
Jan. 13, 2020    (KR) .................. 10-2020-0004070

(51) Int. Cl.
*H10K 59/80*    (2023.01)
*H10K 59/12*    (2023.01)
*H10K 102/00*    (2023.01)

(52) U.S. Cl.
CPC ....... *H10K 59/873* (2023.02); *H10K 59/1201* (2023.02); *H10K 2102/311* (2023.02)

(58) Field of Classification Search
CPC .... H10K 59/873; H10K 59/844; H10K 71/00; H10K 2102/311; H10K 59/1201; H10K 59/12
(Continued)

(56) References Cited

U.S. PATENT DOCUMENTS 7,018,866 B2    3/2006    Sugaya et al.
8,154,135 B2    4/2012    Kim et al.
(Continued)

FOREIGN PATENT DOCUMENTS

CN    109585700 A    4/2019
JP    3524545    5/2004
(Continued)

OTHER PUBLICATIONS

International Search Report issued in corresponding application No. PCT/KR2020/016243 on Mar. 3, 2021.

Primary Examiner — Eric W Jones
(74) Attorney, Agent, or Firm — F. CHAU & ASSOCIATES, LLC

(57) ABSTRACT

A display module includes a display panel including a flat region, and a bending region adjacent to the flat region. A protective layer is disposed on at least one side of the display panel. The protective layer includes a base curing layer disposed on the display panel. A plasma processing layer is disposed on the base curing layer.

14 Claims, 16 Drawing Sheets

(58) Field of Classification Search
USPC .................................. 257/40, 59, 88, 99
See application file for complete search history.

(56) References Cited

U.S. PATENT DOCUMENTS

| | | | |
|---|---|---|---|
| 9,804,428 | B2 | 10/2017 | Chung et al. |
| 10,838,113 | B2 | 11/2020 | Kwon et al. |
| 11,028,284 | B2 | 6/2021 | Ekinaka et al. |
| 11,152,595 | B2 | 10/2021 | Jeon et al. |
| 11,240,414 | B2 | 2/2022 | Park |
| 11,380,868 | B2 | 7/2022 | Qi et al. |
| 2004/0105981 | A1* | 6/2004 | Yializis ............... B05D 1/60 428/421 |
| 2004/0175584 | A1* | 9/2004 | Yializis ............... H01G 4/20 428/461 |
| 2009/0021678 | A1 | 1/2009 | Son et al. |
| 2013/0059105 | A1* | 3/2013 | Wright ............... D21H 19/10 427/515 |
| 2016/0083613 | A1* | 3/2016 | Wright ............... C09J 7/401 427/515 |
| 2016/0172623 | A1 | 6/2016 | Lee |
| 2016/0181346 | A1* | 6/2016 | Kwon ............... H10K 59/131 257/40 |
| 2018/0090700 | A1 | 3/2018 | Nishinohara et al. |
| 2018/0127625 | A1* | 5/2018 | Shafer ............... C09J 133/14 |
| 2021/0095086 | A1* | 4/2021 | McCord ............... C08J 7/042 |

FOREIGN PATENT DOCUMENTS

| | | |
|---|---|---|
| JP | 2008-004489 | 1/2008 |
| JP | 2016-002764 | 1/2016 |
| KR | 10-2007-0071442 | 7/2007 |
| KR | 10-2010-0124012 | 11/2010 |
| KR | 10-1046387 | 7/2011 |
| KR | 20-0466515 | 4/2013 |
| KR | 10-1332442 | 11/2013 |
| KR | 10-2016-0043190 | 4/2016 |
| KR | 10-2017-0123796 | 11/2017 |
| KR | 10-2018-0056753 | 5/2018 |
| KR | 10-2019-0014273 | 2/2019 |
| KR | 10-2019-0087694 | 7/2019 |

* cited by examiner

PROTECTIVE LAYER FOR DISPLAY MODULE AND MANUFACTURING METHOD THEREFOR

CROSS-REFERENCE TO RELATED APPLICATIONS

This application is a national stage entry of International Application Number PCT/KR2020/016243, filed on Nov. 18, 2020, which claims priority to Korean Patent Application No. 10-2020-0004070, filed on Jan. 13, 2020 in the Korean Intellectual Property Office, the disclosures of which are incorporated by reference herein in their entireties.

TECHNICAL FIELD

The present invention relates to a display module and a method for manufacturing the same. More specifically, the present invention relates to a display device with increased durability and increased bending properties of a flexible circuit board.

DISCUSSION OF RELATED ART

In recent years, various display devices are made thin, small, and lightweight. Accordingly, various studies are being conducted for mounting driving elements for displaying an image on a display device in a limited region of the display device.

A flexible circuit board may be provided in the form in which driving elements for displaying an image are directly mounted on a display device, or in the tape carrier package form (TCP) in which a printed circuit board on which driving elements are mounted is connected to a display panel.

The flexible circuit board may be cracked in the repeated bending action of a circuit pattern formed on a circuit board or in the process of coupling the circuit pattern in a bent state, or may be damaged due to tensile force generated during bending.

SUMMARY

An object of the present invention is to provide a display module including a protective layer configured to effectively protect a bending portion and a connection portion.

Another object of the present invention is to provide a method for manufacturing a display module with increased reliability and durability by preventing defects generated during a manufacturing process.

According to an embodiment of the present invention, a display module includes a display panel including a flat region, and a bending region adjacent to the flat region. A protective layer is disposed on at least one side of the display panel. The protective layer includes a base curing layer disposed on the display panel. A plasma processing layer is disposed on the base curing layer.

In an embodiment, the protective layer may include an acrylic polymer, or a thiol-based polymer.

In an embodiment, the protective layer may include a monomer including a plurality of chain portions and a plurality of functional group portions.

In an embodiment, the plasma processing layer comprises a first polymer chain and a second polymer chain that are formed by connecting the plurality of chain portions of the monomer. At least one of the plurality of functional group portions included in the first polymer chain may be cross-linked to the second polymer chain.

In an embodiment, the base curing layer comprises a first base polymer chain and a second base polymer chain that are formed by connecting the plurality of chain portions of the monomer, wherein the first base polymer chain and the second base polymer chain may not be cross-linked to each other.

In an embodiment, the protective layer may overlap the bending region.

In an embodiment, the display panel may further include an opposing region adjacent to the bending region. The opposing region faces the flat region as the bending region is bent.

In an embodiment, the display module may further include a circuit board connected to one end of the display panel, and at least a portion of the circuit board is disposed to face the flat region of the display panel.

In an embodiment, the display panel and the circuit board are connected to each other at a connection portion. The protective layer may be disposed in the connection portion.

In an embodiment, the display panel may include a base layer, a circuit layer disposed on the base layer, a plurality of display elements disposed on the circuit layer and generating light, and an encapsulation layer covering the plurality of display elements. The display module according to an embodiment of the present invention may further include an input sensing layer disposed on the encapsulation layer.

According to an embodiment of the present invention, a display module includes a display panel including a flat region, a bending region adjacent to the flat region, and an opposing region adjacent to the bending region, and facing the flat region when the bending region is in a bent configuration. A protective layer is disposed on the bending region. The protective layer includes a plasma processing layer disposed at an uppermost portion of the protective layer.

According to an embodiment of the present invention, a method for manufacturing a display module including a display panel having a flat region and a bending region adjacent to the flat region includes providing a protective resin on at least one side of the display panel. Plasma is applied on the protective resin to form a protective layer having a plasma processing layer on a surface of the protective layer.

In an embodiment, the forming of a protective layer may include irradiating light on the protective resin to form a preliminary protective layer, and applying the plasma on the preliminary protective layer to form the plasma processing layer.

In an embodiment, the forming of a protective layer may include forming a base curing layer on the display panel. The plasma processing layer is formed on the base curing layer by applying the plasma on an uncured portion of the base curing layer.

In an embodiment, the protective resin may be provided on the bending region of the display panel.

In an embodiment, the display module includes a circuit board connected to one end of the display panel. The display panel and the circuit board are connected to each other at a connection portion. The protective resin may be provided in the connection portion.

In an embodiment, the protective resin may include an acrylic monomer or a thiol-based monomer.

In an embodiment, the protective resin may include a monomer including a plurality of chain portions and a plurality of functional group portions.

In an embodiment, the plasma processing layer includes a first polymer chain and a second polymer chain that are formed by connecting the plurality of chain portions of the monomer. In the applying of plasma, at least one of the plurality of functional group portions included in the first polymer chain may be cross-linked to the second polymer chain.

In an embodiment, the providing of the protective resin and the forming of the protective layer may be performed in a state in which the display module is flat. The method for manufacturing a display module may further include bending the display module after the forming of the protective layer.

According to an embodiment of the present invention, defects caused by an uncured monomer are prevented from being generated in a cover resin disposed in a bending portion and a connection portion, so that the bending properties of a display module may be effectively maintained and the durability thereof may be increased.

DETAILED DESCRIPTION OF EMBODIMENTS

Figure 1:
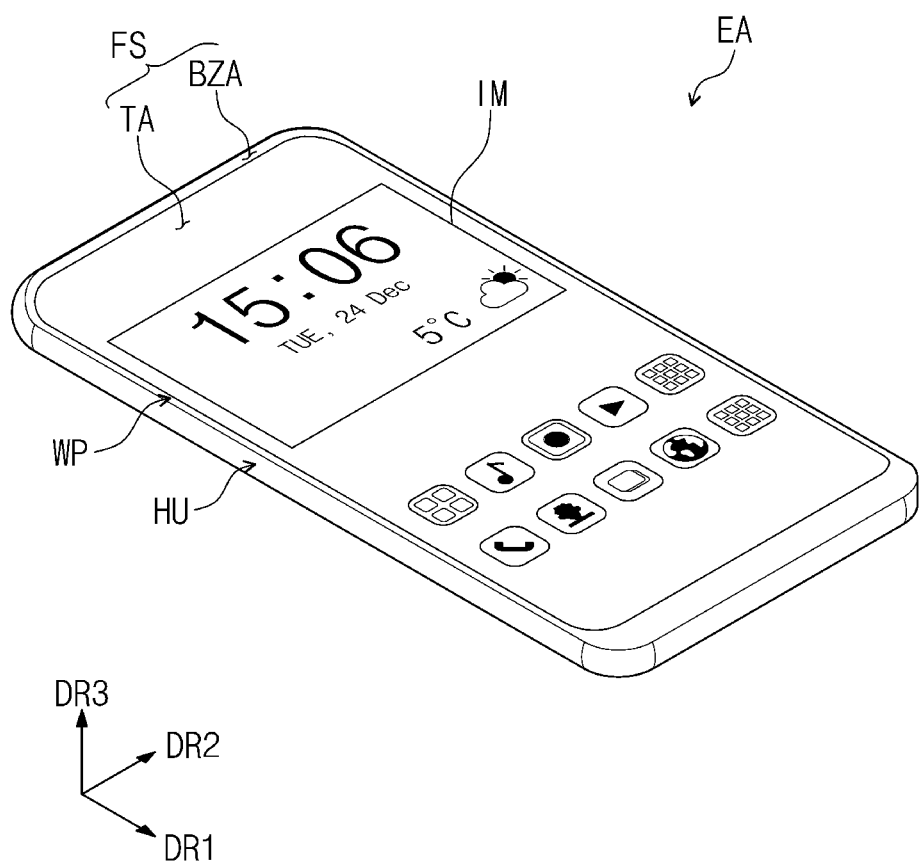
FIG. 1 is a perspective view of a display device according to an embodiment of the present invention.

Hereinafter, embodiments of the inventive concept will be described with reference to the accompanying drawings. In the present disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements may be exaggerated for an effective description of technical contents. The term "and/or" includes any and all combinations of one or more of which associated elements may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings.

It should be understood that the terms "comprise," or "have" are intended to specify the presence of stated features, integers, steps, operations, elements, components, or combinations thereof in the disclosure, but do not preclude the presence or addition of one or more other features, integers, steps, operations, elements, parts, or combinations thereof.

In the present disclosure, when "Component B is directly disposed on Component A," it means that no separate adhesive layer and adhesive member is disposed between Component A and Component B.

Hereinafter, a display module according to an embodiment of the inventive concept and a display device including the same will be described with reference to the accompanying drawings.

Figure 2:
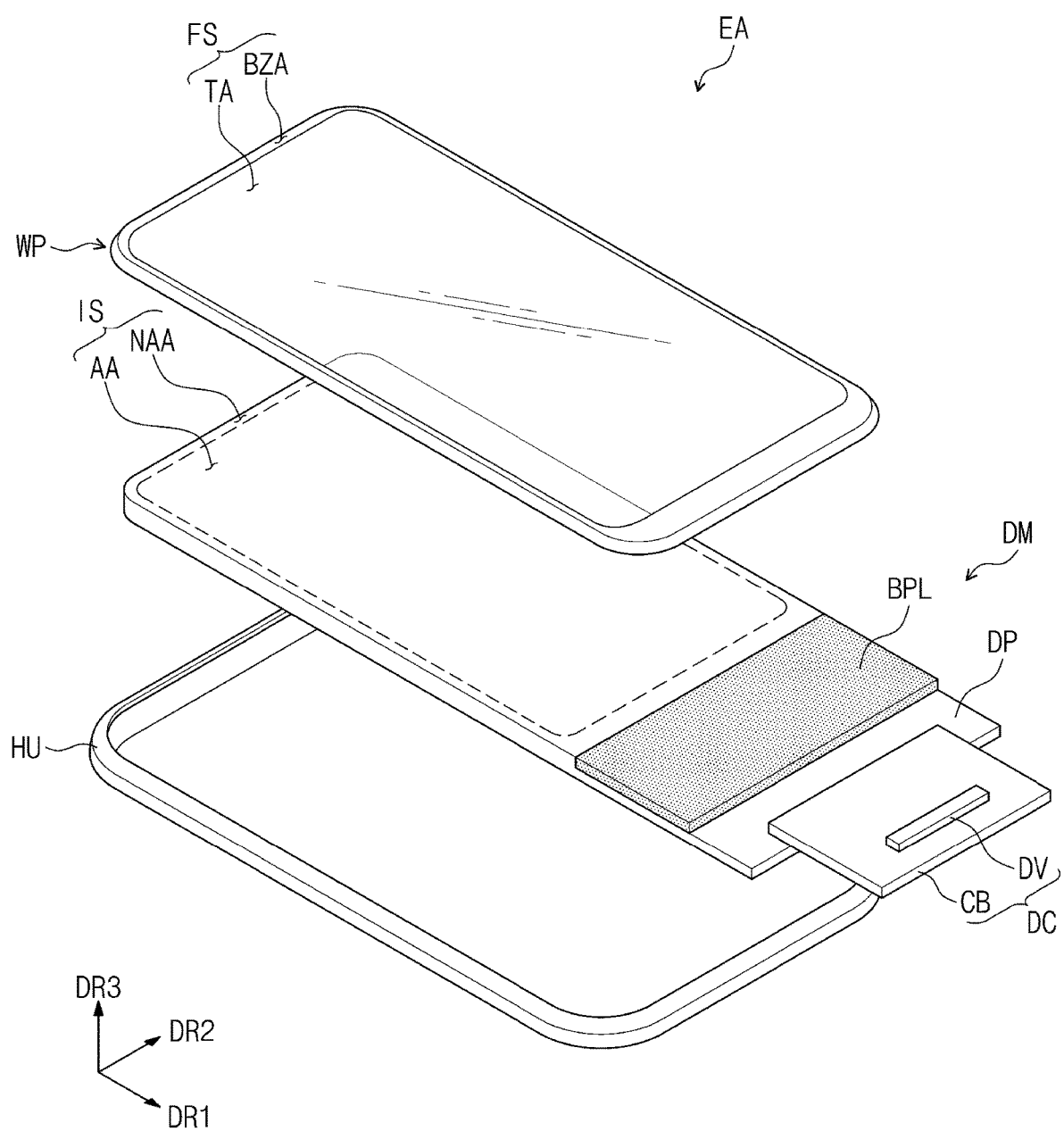
FIG. 2 is an exploded perspective view of a display device according to an embodiment of the present invention.

FIG. 1 is a perspective view of a coupled display device according to an embodiment of the present invention. FIG. 2 is an exploded perspective view of a display device according to an embodiment of the present invention.

Referring to FIG. 1 and FIG. 2, a display device EA may be a device activated by an electrical signal. The display device EA may include various embodiments. For example, the display device EA may be used in large electronic devices such as televisions, monitors, or external advertisement boards, and also in small and medium-sized electronic devices such as personal computers, notebook computers, personal digital terminals, car navigation system units, game machines, portable electronic apparatuses, and cameras. It should be understood that these are merely exemplary embodiments, and the display device EA may be employed in other electronic devices without departing from the inventive concept. In the present embodiment, the display device EA is exemplarily illustrated as a smart phone.

The display device EA may display an image IM toward a third direction DR3 on a display surface FS parallel to each of a first direction DR1 and a second direction DR2. The image IM may include a moving image as well as a still image. In FIG. 1, as an example of the image IM, a watch window and icons are illustrated. The display surface FS on which the image IM is displayed may correspond to a front surface of the display device EA, and may correspond to a front surface of the window WP.

In the present embodiment, a front surface (or an upper surface) and a back surface (or a lower surface) of each member are defined on the basis of a direction in which the image IM is displayed. The front surface and the back surface oppose each other in a third direction DR3 and the normal direction of each of the front surface and the back surface may be parallel to the third direction DR3. Meanwhile, directions indicated by the first to third directions DR1, DR3, and DR3 are relative concepts, and may be converted to different directions. Hereinafter, directions respectively indicated by the first to third directions DR1, DR3, and DR3 are denoted by the same reference numerals and indicate the same directions. In the present disclosure, "on a plane" may mean when viewed in the third direction DR3.

The display device EA may include a window WP, a display module DM, and a housing HU. In the present embodiment, the window WP and the housing HU are coupled to constitute the appearance of the display device EA.

The window WP may include an optically transparent insulation material. For example, the window WP may include glass or plastic. The window WP may have a multi-layered structure or a single-layered structure. For example, the window WP may include a plurality of plastic films coupled with an adhesive, or a glass substrate and a plastic film coupled with an adhesive.

The front surface FS of the window WP defines the front surface of display device EA as described above. The transmissive region TA may be an optically transparent region. For example, the transmissive region TA may be a region having a visible light transmittance of about 90% or higher.

The bezel region BZA may be a region having a relatively low light transmittance compared to the transmissive region TA. The bezel region BZA defines the shape of the transmissive region TA. The bezel region BZA may be adjacent to the transmissive region TA, and may surround the transmissive region TA.

The bezel region BZA may have a predetermined color. The bezel region BZA may cover a peripheral region NAA of the display module DM to block the peripheral region NAA from being viewed from the outside. Meanwhile, this is only exemplarily illustrated, and in the window WP according to an embodiment of the inventive concept, the bezel region BZA may be omitted.

Although not illustrated in FIG. 1 and FIG. 2, a reflection prevention layer RPP (see FIG. 5A) may be disposed between the window WP and the display module DM. The reflection prevention layer reduces the reflectance of external light incident from an upper side of the window WP. In an embodiment of the present invention, the reflection prevention panel may be omitted, or may be a component included in display module DM.

Although not illustrated in FIG. 1 and FIG. 2, an adhesive layer may be further disposed between the window WP and the display module DM. The adhesive layer may be an organic adhesive layer such as an optically clear adhesive (OCA) film, an optically clear resin (OCR), or a pressure sensitive adhesive (PSA) film. The organic adhesive layer may include a polyurethane-based, polyacrylic, polyester-based, polyepoxy-based, or polyvinyl acetate-based adhesive material. In an embodiment, the adhesive layer may be an optically clear adhesive film.

The display module DM may display the image IM and sense an external input. The external input may include various forms of inputs provided from the outside of the display module DM. An external input applied from the outside may be provided in various forms.

For example, the external input may include not only a contact by a part of a user's body, such as a hand, but also an external input (e.g., hovering) applied in close proximity, or adjacent to the display module DM at a predetermined distance. Also, the external input may have various forms such as force, pressure, and light, but is not limited to any one embodiment.

The display module DM may include a display surface IS including an active region AA and the peripheral region NAA. The active region AA may be a region activated by an electrical signal.

In the present embodiment, the active region AA may be a region in which the image IM is displayed, and at the same time, may be a region in which an external input is sensed. The transmissive region TA overlaps at least the active region AA. For example, the transmissive region TA overlaps a front surface or at least a portion of the active region AA. Accordingly, a user may visually recognize the image IM through the transmissive region TA, or may provide an external input. However, this is only exemplarily illustrated. In the active region AA, a region in which the image IM is displayed and a region in which an external input is sensed may be separated from each other, but the embodiment of the inventive concept is not limited to any one embodiment.

The peripheral region NAA may be a region covered by the bezel region BZA. The peripheral region NAA is adjacent to the active region AA. The peripheral region NAA may surround the active region AA. In the peripheral region NAA, a driving circuit or a driving line for driving the active region AA may be disposed.

The display module DM includes a display panel DP and a circuit board DC.

The display panel DP may be a component which substantially generates the image IM. The image IM generated by the display panel DP is visually recognized by a user from the outside through the transmissive region TA. In an embodiment, the active region AA and the peripheral region NAA of the display module DM may substantially mean the active region AA and the peripheral region NAA of the display panel DP. That is, the display panel DP may include the entire display surface IS including the active region AA and the peripheral region NAA.

The housing HU is coupled to the window WP. The housing HU is coupled to the window WP to provide a predetermined internal space. The housing HU may include a plurality of sidewall portions, and the plurality of sidewall portions of the housing HU and the window WP may provide a predetermined internal space. The display module DM may be received in the internal space.

The housing HU may include a material having relatively high rigidity. For example, the housing HU may include glass, plastic, or a metal, or may include a plurality of frames and/or plates composed of a combination thereof. The housing HU may stably protect components of the display device EA accommodated in an internal space from an external impact.

Figure 3:
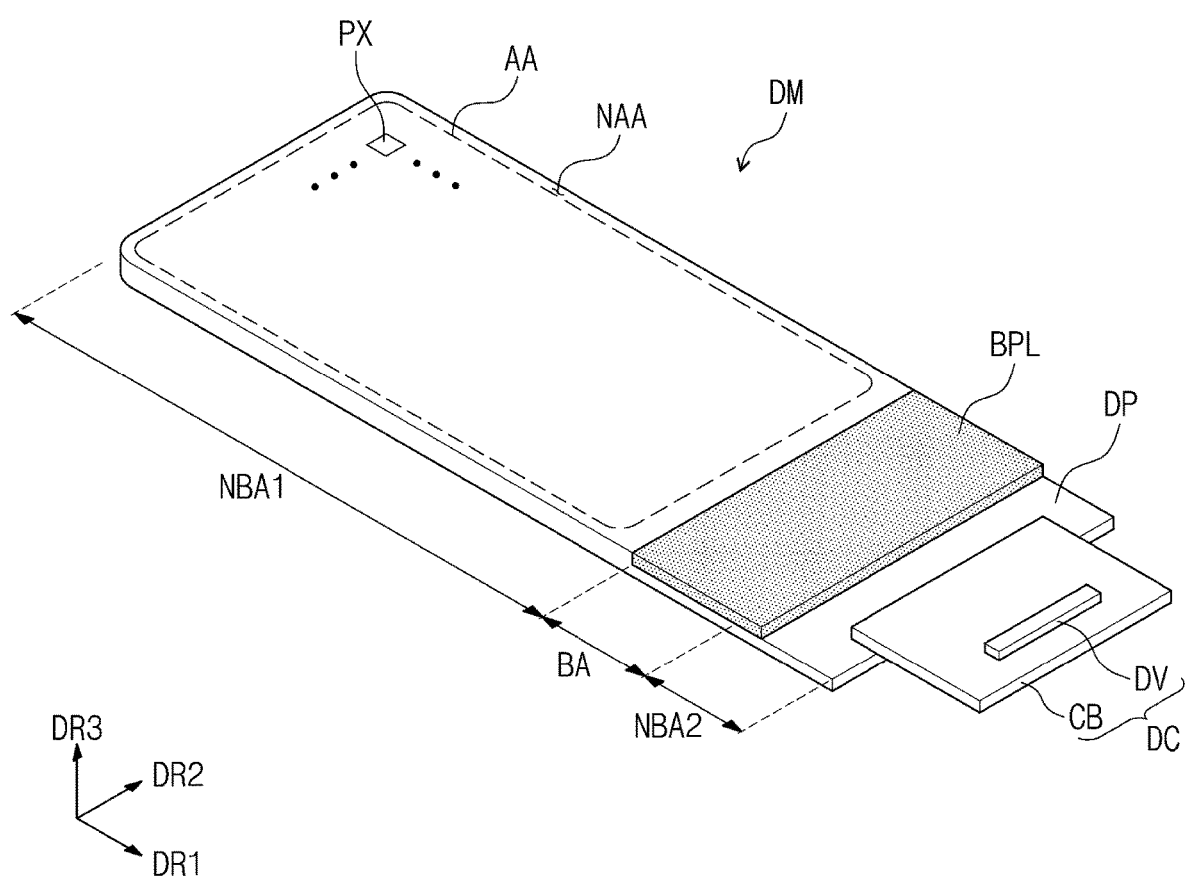
FIG. 3 is a perspective view of a display module according to an embodiment of the present invention.
Figure 4:
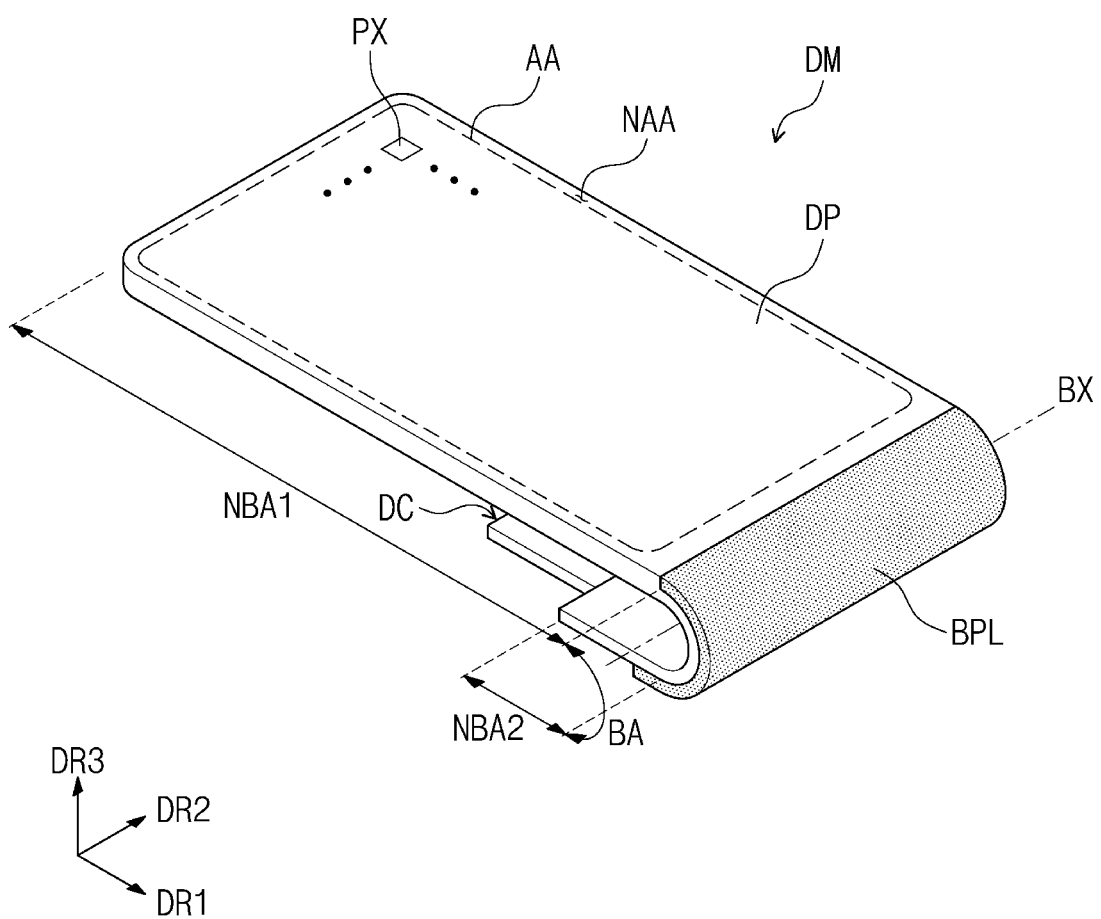
FIG. 4 is a perspective view illustrating that a portion of the display module illustrated in FIG. 3 is bent.

FIG. 3 is a perspective view of a display module according to an embodiment of the present invention, and FIG. 4 is a perspective view illustrating that a portion of the display module illustrated in FIG. 3 is bent.

Referring to FIG. 3 and FIG. 4, the display module DM according to an embodiment of the present invention has a rectangular shape which has long sides in the first direction DR1 and short sides in the second direction DR2 which is perpendicular to the first direction DR1. This is an example of a specified shape of the display module DM for convenience of description, and the present invention is not particularly limited to the shape of the display module DM.

The display module DM may display the image IM (see FIG. 1) through a display surface IS. The display surface IS is parallel to a plane defined by the first direction DR1 and the second direction DR2. The normal direction of the display surface 1S, that is, the thickness direction of the display device DM, is indicated by the third direction DR3.

The display surface IS includes the active region AA in which the image IM is displayed and the peripheral region NAA adjacent to the active region AA. The active region AA is defined in a central region of the display module DM. The peripheral region NAA is a region in which the image IM is not displayed. The peripheral region NAA is defined to surround the active region AA on the display surface IS. The active region AA may be a region in which a pixel PX is disposed, and the peripheral region NAA may be a region in which the pixel PX is not disposed.

The display module DM includes the display panel DP and the circuit board DC. The display panel DP displays the image IM. Substantially, the display surface IS may be defined on an upper surface of the display panel DP.

In the display panel DP, a plurality of regions NBA1, BA, and NBA2 arranged in the first direction DR1 on a plane may be defined. Each of the plurality of regions NBA1, BA, and NBA2 is defined according to the type of operation of the display panel DP.

Specifically, on a plane, a first region NBA1, a second region NBA2, and a third region BA between the first region NBA1 and the second region NBA2 are defined in the display module DM. The first region NBA1 includes the active region AA, and overlaps a portion of the peripheral region NAA. The first region NBA1 is not bent.

The second region NBA2 is defined on one side of the display panel DP in the first direction DR1. The second region NBA2 overlaps another portion of the peripheral region NAA. The second region NBA2 is not bent. The circuit board DC to be described later may be connected to the second region NBA2.

The third region BA is a region bent around a bending axis BX parallel to the second direction DR2, and is a region substantially forms a curvature. Hereinafter, the first region NBA1, the second region NBA2, and the third region BA are respectively referred to as a flat region NBA1, an opposing region NBA2, and a bending region BA.

As illustrated in FIG. 4, when the bending region BA of the display module DM is bent, a portion of the display module DM corresponding to the opposing region NBA2 may be disposed below a portion of the display module DM corresponding to the flat region NBA1. That is, the opposing region NBA2 may overlap a portion of the flat region NBA1 on a plane.

A width in the first direction DR1 of the flat region NBA1 may be different from a width in the first direction DR1 of the opposing region NBA2. Specifically, the width in the first direction DR1 of the flat region NBA1 may be greater than the width in the first direction DR1 of the opposing region NBA2. Therefore, when the display module DM is bent, the opposing region NBA2 may not be visually recognized due to the flat region NBA2.

The circuit board DC is connected to one side of the display panel DP in the first direction DR1. That is, the circuit board DC is connected to the flat region NBA1 of the display panel DP. The circuit board DC may include a flexible film CB and a driving circuit DV.

The flexible film CB is connected to the flat region NBA1 of the display panel DP. The flexible film CB may be electrically connected to the display module DM through an adhesive member. The adhesive member may be a transparent adhesive or an anisotropic conductive film.

The driving circuit DV may be mounted on the flexible film CB. The driving circuit DV is electrically connected to the flexible film CB through circuit wires (not shown) included in the flexible film CB. The flexible film CB may electrically connect the driving circuit DV and the display panel DP, and the driving circuit DV may generate an electrical signal to be provided to the display panel DP or process an electrical signal provided from the display panel DP.

The display module DM may include a bending portion protective layer BPL overlapping at least the bending region BA. Hereinafter, the bending portion protective layer BPL will be described in detail later.

Figure 5A:
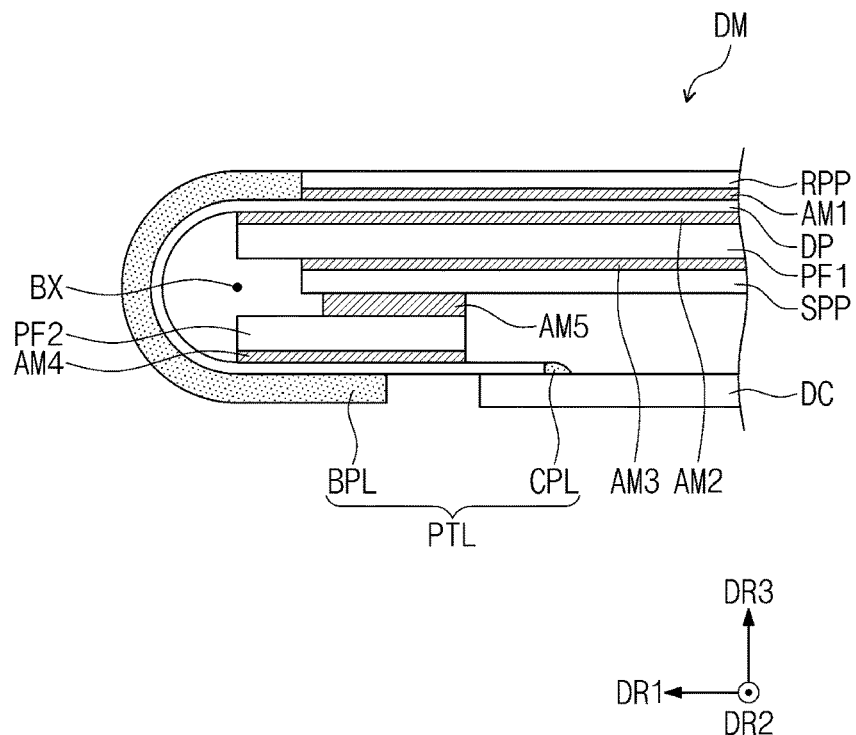
FIG. 5A and FIG. 5B are cross-sectional views of a display module according to an embodiment of the present invention.
Figure 5B:
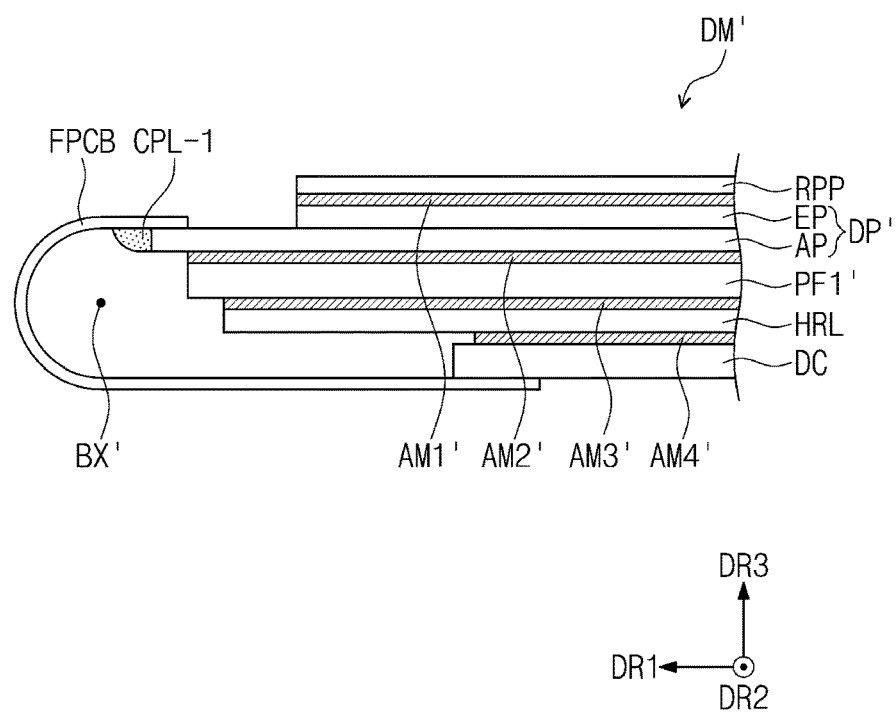

FIG. 5A is a cross-sectional view of a portion of a display device according to an embodiment of the present invention. FIG. 5B is a cross-sectional view of a portion of a display device according to another embodiment of the present invention, FIG. 5A and FIG. 5B illustrate cross-sectional views of a display module according to an embodiment of the present invention.

As illustrated in FIG. 5A, the display module DM may include the display panel DP, the reflection prevention layer RPP, protective films PF1 and PF2, a support panel SPP, and the circuit board DC.

Figure 8A:
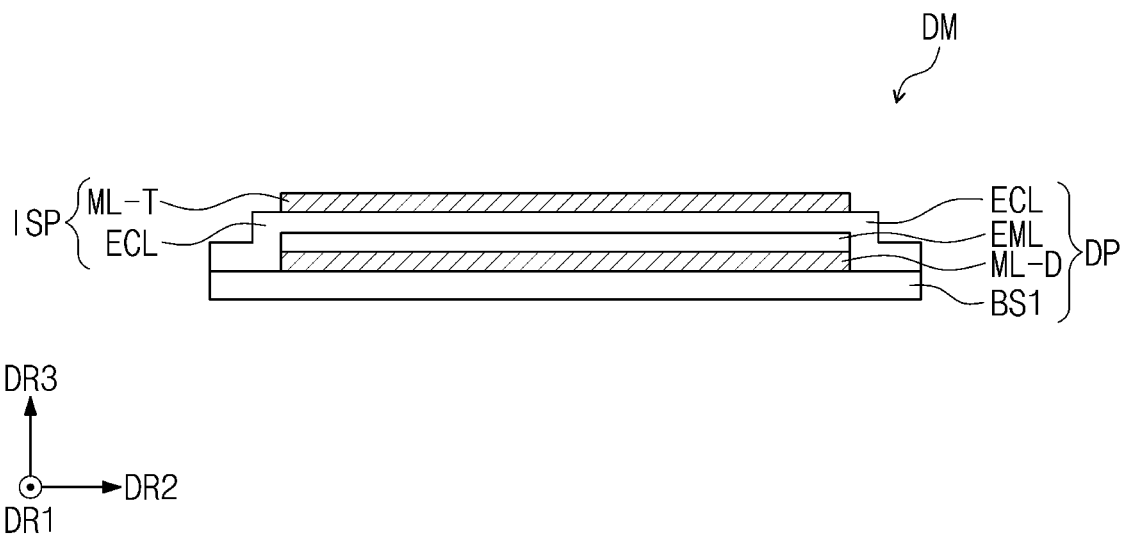
FIG. 8A and FIG. 8B are cross-sectional views of a display module according to an embodiment of the present invention.

The display panel DP may be a flexible display panel, for example, an organic light emitting display panel. Hereinafter, the same description given above may be applied to the description of the display panel DP. In addition, although not illustrated, an input sensing unit ISP (see FIG. 8A) may be disposed on the display panel DP. As illustrated in FIG. 8A, when the input sensing unit ISP is directly formed on the display panel DP, the driving of the input sensing unit ISP may be controlled without a separate circuit board.

The reflection prevention layer RPP may include a polarizing film and/or a phase retardation film. Depending on an operation principle of the reflection prevention layer RPP, the number of phase retardation films and the phase retardation length of a phase retardation film may be determined. The reflection prevention layer RPP may include color filters.

The protective films PF1 and PF2 are disposed on a rear surface of the display panel DP. In the present embodiment, a protective film PF may include a first protective film PF1 and a second protective film PF2 which are disposed spaced apart from each other. The first protective film PF1 may be disposed in correspondence to the flat region NBA1 (FIG. 4) of the display panel DP, and the second protective film PF2 may be disposed in correspondence to the opposing region NBA2 (FIG. 4) of the display panel DP.

The protective films PF1 and PF2 may include a plastic film as a base layer. The protective films PF1 and PF2 may include a plastic film containing any one selected from the group consisting of polyethersulfone (PES), polyacrylate (PAR), polyetherimide (PEI), polyethyelene napthalate (PEN), polyethyleneterephthalate (PET), polyphenylene sulfide (PPS), polyarylate, polyimide (PI), polycarbonate (PC), poly(arylene ethersulfone), and a combination thereof.

A material constituting the protective films PF1 and PF2 is not limited to plastic resins, and may include an organic/inorganic composite material. The protective films PF1 and PF2 may include a porous organic layer, and an inorganic matter filled in pores of the organic layer.

The support panel SPP are disposed on back surfaces of the protective films PF1 and PF2 and support the display panel DP and the protective film PF. The support panel SPP may be a metal plate having rigidity greater than or equal to a reference value. The support panel SPP may be a stainless steel plate. The support panel SPP may be black in order to block external light incident on the display panel DP.

The circuit board DC may be connected to one end of the display panel DP to generate an electrical signal to be provided to the display panel DP or process an electrical signal provided from the display panel DP. FIG. 5A exemplarily illustrates that one circuit board DC is connected to the display panel DP, but the present invention is not limited thereto, and an additional circuit board may be connected to the other end spaced apart from one end of the display panel DP to which the circuit board DC is connected. On the additional circuit board, a plurality of passive elements and active elements and the like may be mounted. The additional circuit board may be electrically connected to a motherboard of a display device through an electronic component connector.

FIG. 5A exemplarily illustrates the reflection prevention layer RPP separately provided, but the reflection prevention layer RPP may be omitted. The reflection prevention layer RPP may be integrated into the display panel DP through a continuous process. In an embodiment, color filters disposed on an encapsulation layer ECL (see FIG. 8A) may have the function of the reflection prevention layer RPP. In an embodiment of the present invention, the protective film PF may be omitted.

Among each component described above, a first adhesive member AM1 to a fifth adhesive member AM5 may be disposed. Each of the first adhesive member AM1 to the fifth adhesive member AM5 may be a pressure sensitive adhesive (PSA) film, an optically clear adhesive (OCA) film, or an optically clear resin (OCR). The first adhesive member AM1 to the fifth adhesive member AM5 include a photocuring adhesive material or a heat-curable adhesive material, and the material thereof is not particularly limited. In addition, some of the first adhesive member AM1 to the fifth adhesive member AM5 may be omitted.

The display module DM includes a protective layer PTL disposed on one side of the display panel DP. The protective layer PTL may include a bending portion protective layer BPL and a connection portion protective layer CPL.

The display module DM is bent around the bending axis BX, and may include the bending portion protective layer BPL disposed in the bending region BA (see FIG. 4) of the display panel DP. 70% or more of the total area of the bending portion protective layer BPL may be disposed in the bending region BA. A portion of the bending portion protective layer BPL may overlap the flat region NBA1 and the opposing region NBA2. The bending portion protective layer BPL may be disposed in the bending region BA, and perform a function of reducing stress generated as the display module DM is bent. The bending portion protective layer BPL may generate a neutral plane of the bending region BA defined during bending adjacent to a circuit layer ML-D (see FIG. 8A) of the display panel DP.

The display module DM may include a connection portion protective layer CPL disposed at a connection portion where the display panel DP and the circuit board DC are connected. The connection portion protective layer CPL may be disposed at a boundary portion where the display panel DP and the circuit board DC are connected, and may come into contact with one side surface of the display panel DP and one surface of the circuit board DC. The connection portion protective layer CPL may prevent penetration of moisture, oxygen, and the like to prevent corrosion of a pad part and the like disposed at a connection portion, and may serve to reinforce connection strength between the display panel DP and the circuit board DC to ensure connection reliability.

The protective layer PTL includes a polymer resin. The protective layer PTL may include an acrylic polymer, or a thiol-based polymer. The protective layer PTL may include a monomer including a chain portion and a functional group portion, and may include a polymer formed as the monomer is cured. The protective layer PTL may include a plurality of polymer chains formed as chain portions of monomers are connected.

FIG. 5B illustrates a cross-section of a display module DM' included in a display device according to another embodiment of the present invention. As illustrated in FIG. 5B, the display module DM' may include a display panel DP', a flexible printed circuit board FPCB, a reflection prevention layer RPP, a protective film PF1', and a circuit board DC.

The display panel DP' may include a display substrate AP and an encapsulation substrate EP. The display panel DP' may be an organic light emitting display panel. The protective film PF1' may be disposed on a rear surface of the display panel DP' and protect the display panel DP' from physical impacts. Hereinafter, the same descriptions given with reference to FIG. 5A may be applied to the reflection prevention layer RPP, the display panel DP', the protective film PF1' and the circuit board DC.

The flexible printed circuit board FPCB may include a plurality of signal lines. The flexible printed circuit board FPCP may be connected to the display panel DP' and the display panel DP and the flexible printed circuit board FPCB may be electrically connected to each other by the plurality of signal lines included in the flexible printed circuit board FPCB. The flexible printed circuit board FPCB may be bent around a bending axis BX'.

The display module DM may include a protective layer disposed on one side of the display panel DP, that is, a connection portion protective layer CPL-1 disposed at a connection portion of the display panel DP and the flexible printed circuit board FPCB. The connection portion protective layer CPL-1 may be disposed on one side surface of the display panel DP, and disposed at a boundary portion where the flexible printed circuit board FPCB is connected, and thus, may prevent the penetration of moisture, oxygen, and the like to prevent the corrosion of components included in the display panel DP and the flexible printed circuit board FPCB. In addition, the connection portion protective layer CPL-1 may perform a function of reinforcing connection strength between the display panel DP and the flexible printed circuit board FPCB and securing connection reliability.

The display module DM may further include a heat dissipating member HRL which absorbs heat generated in the circuit board DC and then disperse the heat to the outside on a plane. The heat dissipating member HRL may be disposed below the protective film PF1', and the heat dissipating member HRL may include a layer or material having a thermal conductivity of 200 W/mK or greater. For example, the heat dissipating member HRL may include a metal layer. The metal layer may include copper, gold, silver, or aluminum. However, the material of the heat dissipating member HRL is not limited thereto. For example, the heat dissipating member HRL may include a graphite layer, not a metal layer.

Among each component described above, a first adhesive member AM1' to a fourth adhesive member AM4' may be disposed. Hereinafter, the same description given with reference to FIG. 5A may be applied to the adhesive members.

Figure 6A:
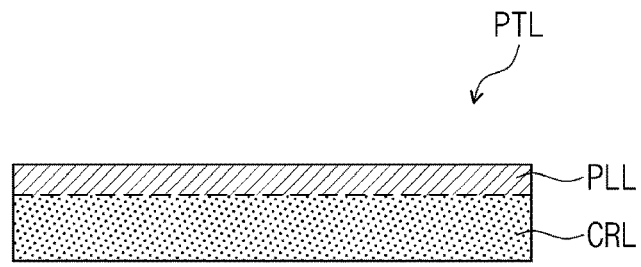
FIG. 6A is a cross-sectional view schematically showing a protective layer included in a display module according to an embodiment of the present invention.
Figure 6B:
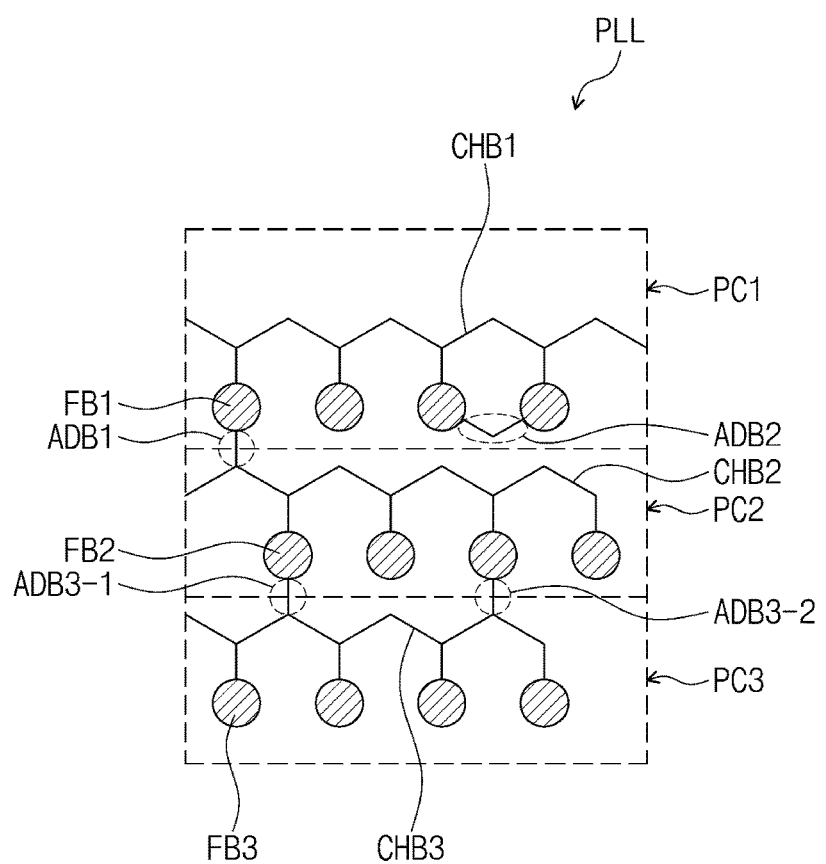
FIGS. 6B and 6C are schematic views schematically showing some components of a protective layer according to an embodiment of the present invention.
Figure 6C:
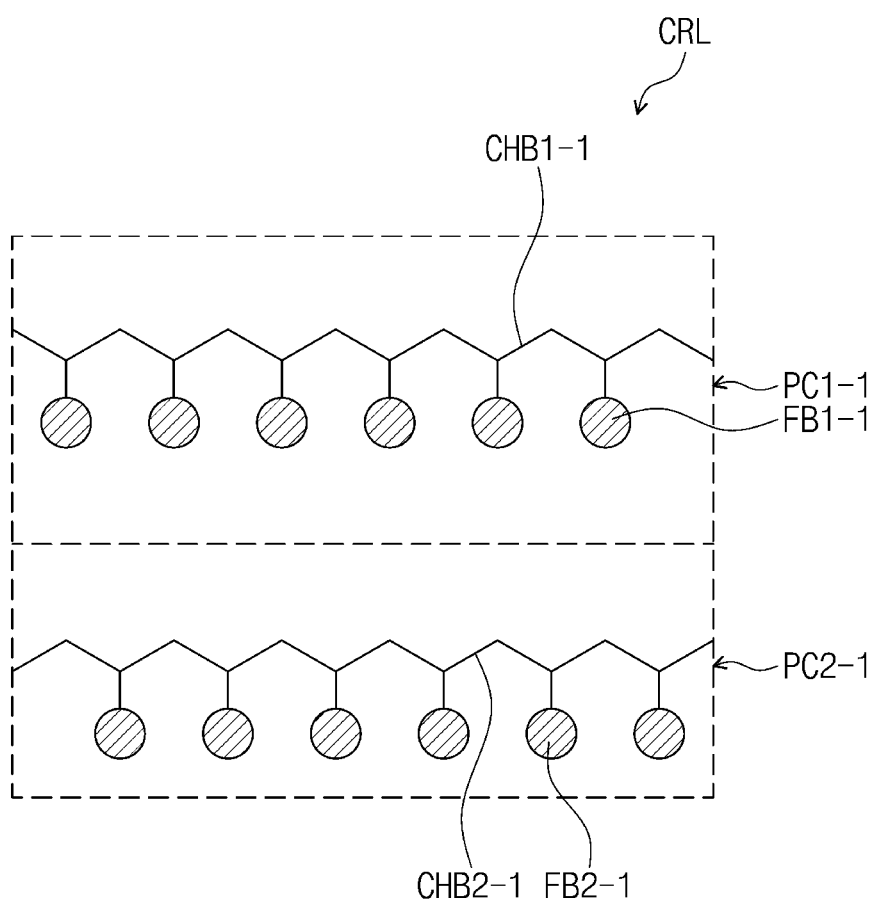

FIG. 6A is a cross-sectional view schematically showing a protective layer included in a display module according to an embodiment of the present invention. FIGS. 6B and 6C are schematic views schematically showing some components of a protective layer according to an embodiment of the present invention. FIG. 6B and FIG. 6C schematically illustrate the coupling-crosslinking relationship between polymers of a plasma processing layer PLL and a base curing layer CRL in the protective layer PTL.

Referring to FIG. 6A together, the protective layer PTL according to an embodiment of the present invention includes the plasma processing layer PLL and the base curing layer CRL.

Referring to FIG. 5A, FIG. 5B, and FIG. 6A together, the protective layer PTL may be a layer disposed on one side of the display panels DP and DP', and the plasma processing layer PLL may be a layer disposed on the uppermost portion of the protective layer PTL In an embodiment, when the protective layer PTL is the bending portion protective layer BPL, the base curing layer CRL may be a layer disposed adjacent on the display panel DP, and the plasma processing layer PLL may be a layer disposed on the base curing layer CRL to be exposed to the outermost periphery. In an embodiment, when the protective layer PTL is the connection portion protective layers CPL and CPL-1, the base curing layer CRL may be a layer disposed adjacent to the circuit board DC or the flexible printed circuit board FPCB, and the plasma processing layer PLL may be a layer disposed on the base curing layer CRL to be exposed on the outermost periphery.

Referring to FIG. 6A to FIG. 6C, the protective layer PTL may include a plurality of polymer chains formed by cross-linking chain portions of monomers including a chain portion and a functional group portion. The functional group portion may include an acrylate group, a thiol group, or the like. More specifically, the plasma processing layer PLL may include a first polymer chain PC1 including a first chain portion CHB1 and a first functional group portion FB1, a second polymer chain PC2 including a second chain portion CHB2 and a second functional group portion FB2, and a third polymer chain PC3 including a third chain portion CHB3 and a third functional group portion FB3. The base curing layer CRL may include a first base polymer chain PC1-1 including a first base chain portion CHB1-1 and a first base functional group portion FB1-1, and a second base polymer chain PC2-1 including a second base chain portion CHB2-1 and a second base functional group portion FB2-1.

The plasma processing layer PLL may be a layer in which additional crosslinking has occurred between polymer chains included in the protective layer PTL by plasma processing. More specifically, at least one of functional group portions included in the plurality of polymer chains included in the plasma processing layer PLL may form additional cross-linking with an adjacent functional group portion, or another polymer chain. As illustrated in FIG. 6B, the plasma processing layer PLL includes a first polymer chain PC1, a second polymer chain PC2, and a third polymer chain PC3, and in addition to forming the cross-linking between the first to third chain portions CHB1, CHB2, and CHB3 by a curing process of monomers, an additional cross-link ADB1 in the form in which a functional group portion FB1 included in the first polymer chain PC1 is cross-linked with the second polymer chain PC2, an additional cross-link ADB2 in the form in which adjacent functional group portions FB1 included in the first polymer chain PC1 are cross-linked to each other, additional cross-links ADB3-1 and ADB3-2 in the form in which a plurality of functional group portion FB2 included in the second polymer chain PC2 are cross-linked to the third polymer chain PC3, and the like may be formed. The plasma processing layer PLL may be a layer having a higher modulus of elasticity than the base curing layer CRL through the additional cross-links ADB1, ADB2, ADB3-1, and ADB3-2 formed between polymer chains.

The base curing layer CRL may be a layer in which chain portions of monomers are cross-linked to each other during photo-curing and the like. The base curing layer CRL may include the first base polymer chain PC1-1 and the second base polymer chain PC2-1, and an additional cross-link may not be formed between the first base polymer chain PC1-1 and the second base polymer chain PC2-1.

A display module according to an embodiment includes a bending region in which a display panel is bent, and a protective layer formed through a polymer resin at a connection portion where the display panel and a circuit board are connected, and on the outermost periphery of the protective layer, a plasma processing layer formed through plasma processing is disposed. Through the above, when the polymer resin including an acrylic polymer, a thiol-based polymer, or the like is photo-cured or thermal-cured, even when the curing reaction is inhibited due to oxygen and the like in the atmosphere, and thus, an unreacted portion is formed, a plasma processing layer in which a curing reaction and an additional cross-link formation reaction have occurred is formed by plasma processing, so that the reliability of the display module may be increased.

Figure 7:
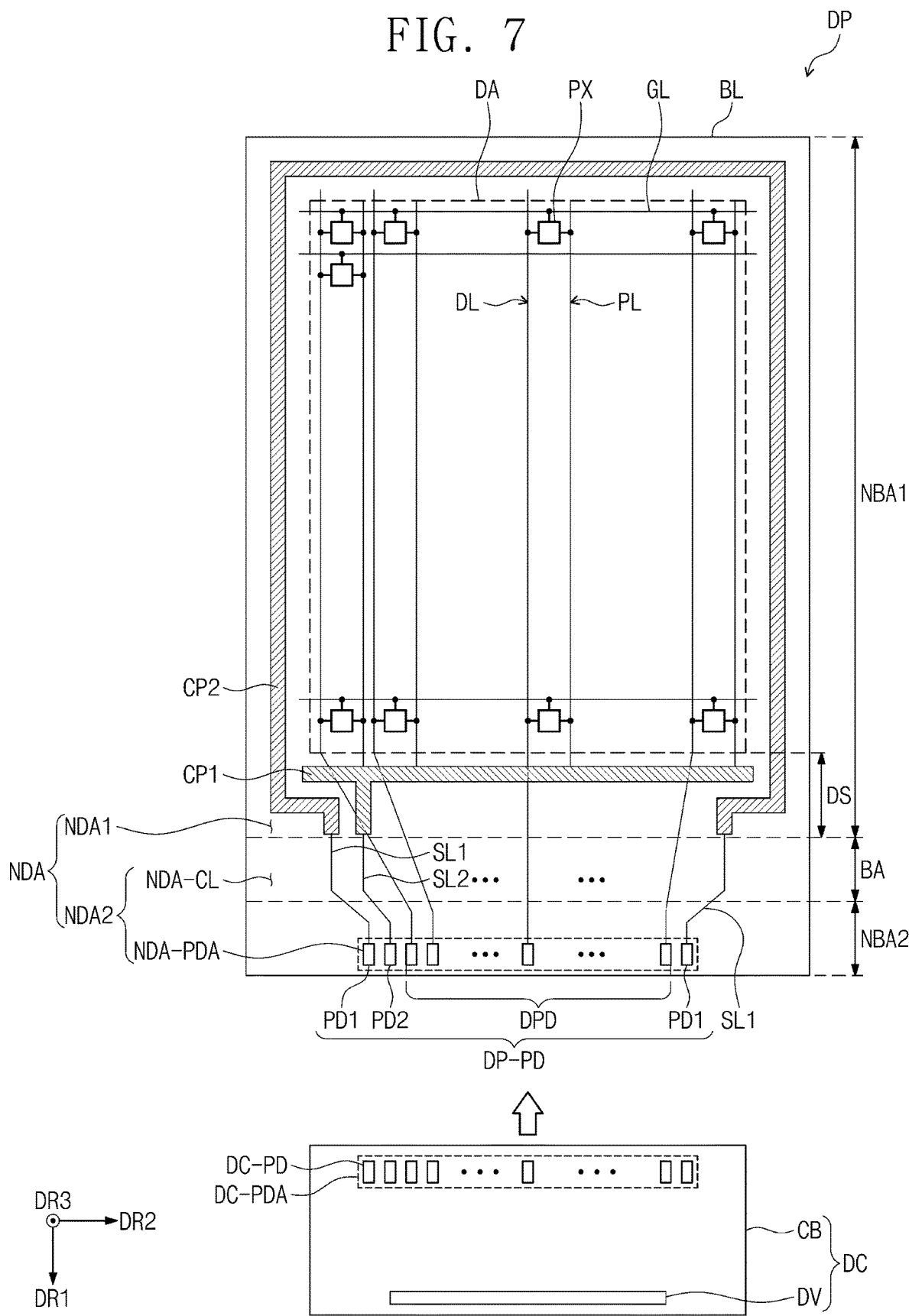
FIG. 7 is a plan view of a display module according to an embodiment of the present invention.

FIG. 7 is a plan view of a display module according to an embodiment of the present invention.

Referring to FIG. 7, the display panel DP includes a display region DA and a non-display region NDA on a plane. The display region DA may correspond to the active region AA illustrated in FIG. 3 and FIG. 4. The non-display region NDA may correspond to the peripheral region NAA illustrated in FIG. 3 and FIG. 4. The non-display region NDA may surround the display region DA by being defined along the edge of the display region DA.

Specifically, the non-display region NDA includes a first non-display region NDA1 and a second non-display region NDA2. The first non-display region NDA1 is disposed to surround the display region DA. On the first non-display region NDA1, conductive patterns CP1 and CP2 to be described later may be disposed. In the present embodiment, the first non-display region NDA1 and the display region DA may entirely overlap the flat region NBA1.

The second non-display region NDA2 is defined adjacent to one side of the first non-display region NDA1 in the first direction DR1. The second non-display region NDA2 includes a wiring region NDA-CL and a panel pad region NDA-PDA.

The wiring region NDA-CL overlaps the bending region BA. Although the wiring region NDA-CL is illustrated to be the same as the bending region BA in FIG. 7, in another embodiment of the present invention, the wiring region NDA-CL may be defined wider than the bending region BA on the display panel DP.

The panel pad region NDA-PDA is defined on one side of the second non-display region NDA2 in the first direction DR1. The panel pad region NDA-PDA overlaps the opposing region NBA2.

On a plane, the display panel DP includes a plurality of conductive patterns CP1 and CP2, a plurality of signal lines DL, GL, PL, SL1, and SL2, a plurality of panel pads DP-PD, and a plurality of pixels PX.

The pixels PX are disposed in the display region DA. Each of the pixels PX includes an organic light emitting element and a pixel driving circuit connected thereto. The signal lines DL, GL, PL, SL1, and SL2, the plurality of conductive patterns CP1 and CP2, the plurality of panel pads DP-PD, and pixel driving circuits may be included in a circuit layer CL illustrated in FIG. 4.

The signal lines DL, GL, PL, SL1, and SL2 are formed across the entire regions DA and NDA of the display panel DP. The signal lines DL, GL, PL, SL1, and SL2 include scan lines GL, data lines DL, a power line PL, a first signal line SL1, and a second signal line SL2.

Each of the scan lines GL is connected to a corresponding pixel PX among the pixels PX, and each of the data lines DL is connected to a corresponding pixel PX among the pixels PX. The power line PL is connected to the pixels PX. The first signal line SL1 is connected to a first conductive pattern CP1, and the second signal line SL2 is connected to a second conductive pattern CP2.

The conductive patterns CP1 and CP2 are disposed in the first non-display region NDA1. The conductive patterns CP1 and CP2 include the first conductive pattern CP1 and the second conductive pattern CP2. The first conductive pattern CP1 and the second conductive pattern CP2 are insulated from each other. FIG. 7 illustrates that the first conductive pattern CP1 and the second conductive pattern CP2 are disposed spaced apart from each other on the first non-display region NDA1. However, in another embodiment of the inventive concept, the first conductive pattern CP1 and the second conductive pattern CP2 may be disposed on different layers from each other. In this case, the first conductive pattern CP1 and the second conductive pattern CP2 may be disposed overlapping each other on a plane.

The first conductive pattern CP1 may be connected to power lines PL extended from the display region DA. The power lines PL may be connected to a single first conductive pattern CP1 and provide a first power voltage ELVDD (FIG. 9) of the same potential to each of the pixels PX.

The second conductive pattern CP2 is connected to an organic light emitting element OLED and provides a second power signal. The second conductive pattern CP2 may provide a second power voltage ELVSS (FIG. 9) of substantially the same potential to each of the pixels PX.

The plurality of panel pads DP-PD are disposed in the panel pad region NDA-PDA. The plurality of panel pads DP-PD include a first signal pad PD), a second signal pad PD2, and a plurality of display signal pads DPD. The first signal pad PD1 is connected to the first signal line SL1. The second signal pad PD2 is connected to the second signal line SL2. The display signal pads DPD are connected to corresponding data lines DL.

Substantially, signal lines DL. GL, and PL connected to the pixel PX constitute most of the signal lines DL, GL, PL, SL1, and SL2. The signal lines DL, GL, and PL connected to the pixel PX are connected to transistors T1 to T7 (FIG. 9) of the pixel PX. The signal lines DL, GL, and PL connected to the pixel PX may have a single-layered/multi-layered structure, and may be a single body, or may include two or more parts. The two or more parts are disposed on different layers, and may be connected to each other through a contact hole passing through an insulation layer disposed between the two or more parts.

In FIG. 7, the circuit board DC electrically connected to the display panel DP is additionally illustrated. The flexible film CB of the circuit board DC may include board pads DC-PD electrically connected to the display panel DP. A region in which the board pads DC-PD are disposed is defined as a board pad region DC-PDA, and the board pad region DC-PDA may be defined in correspondence to the panel pad region NDA-PDA of the display panel DP. The board pad region DC-PDA and the panel pad region NDA-PDA may be electrically connected through an anisotropic conductive film (ACF) or the like, or pads disposed in the board pad region DC-PDA and the panel pad region NDA-PDA may be directly connected to each other through ultrasonic bonding or the like. Although not illustrated, the flexible film CB may further include signal lines which connect the board pads DC-PD and the driving circuit DV. The driving circuit DV disposed on the circuit board DC may be directly mounted on the display panel DP.

FIG. 8A is a cross-sectional view of a display module according to an embodiment of the present invention.

Referring to FIG. 8A, the display module DM may include the display panel DP and the input sensing unit ISP. The input sensing unit ISP may also be referred to as an input sensing layer.

The display panel DP may include a first substrate BS1, a circuit layer ML-D, a display element layer EML, and the encapsulation layer ECL. The input sensing unit ISP may include a base layer ECL and a sensing circuit layer ML-T. The encapsulation layer ECL of the display panel DP and the base layer ECL of the input sensing unit ISP may be of the same configuration.

According to an embodiment of the inventive concept, the display panel DP and the input sensing unit ISP may be formed in a series of processes. That is, the sensing circuit layer ML-T may be directly disposed on the encapsulation layer ECL. The sensing circuit layer ML-T may include a plurality of insulation layers and a plurality of conductive layers. The plurality of conductive layers may constitute a sensing electrode configured to sense an external input, a sensing line connected to the sensing electrode, and a sensing pad connected to the sensing line.

The display panel DP according to an embodiment of the present invention may be a light emitting-type display panel, but is not particularly limited thereto. For example, the display panel DP may be an organic light emitting display panel or a quantum dot light emitting display panel.

The first substrate BS1 may be a silicon substrate, a plastic substrate, a glass substrate, an insulation film, or a laminated structural body including a plurality of insulation layers. The first substrate BS1 may be a display substrate on which a circuit layer, a display layer, and the like are disposed.

The circuit layer ML-D may be disposed on the first substrate BS1. The circuit layer ML-D may include a plurality of insulation layers, a plurality of conductive layers, and a semiconductor layer. The plurality of conductive layers of the circuit layer ML-D may constitute a control circuit of signal lines or of a pixel.

The display element layer EML may be disposed on the circuit layer ML-D. The display element layer EML may be a layer which generates light or which controls the transmittance of light. For example, a display element layer EML of an organic light emitting display panel may include an organic light emitting material. A display element layer EML of a quantum dot light emitting display panel may include at least one of a quantum dot and a quantum load.

A display element layer EML of a liquid crystal display panel may include a liquid crystal layer.

Figure 8B:
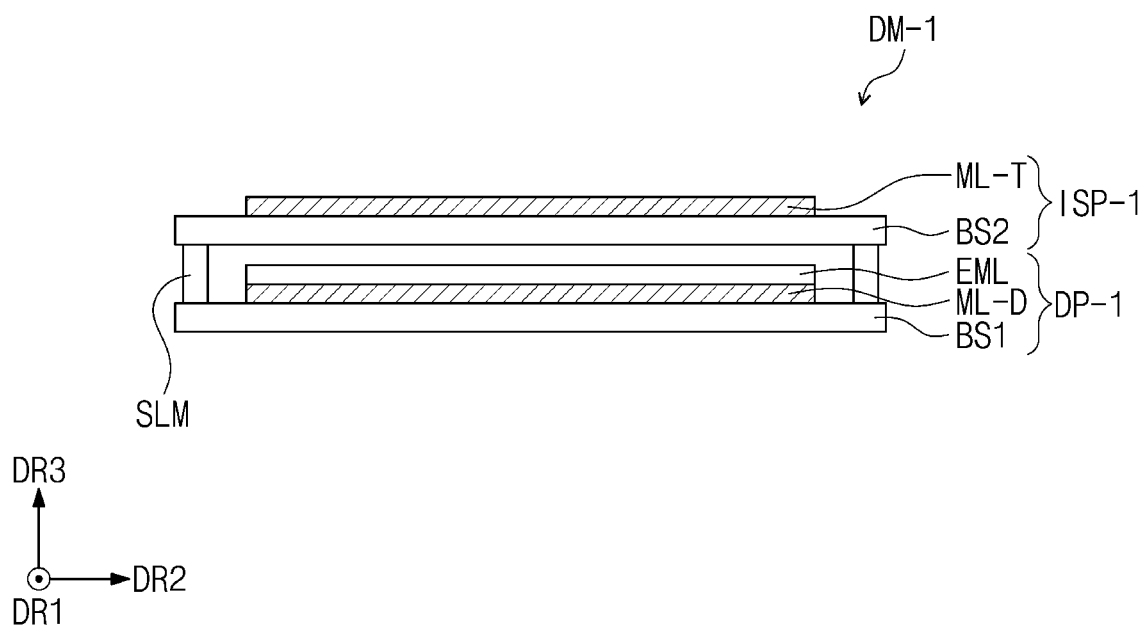

FIG. 8B is a cross-sectional view of a display device according to an embodiment of the inventive concept.

Referring to FIG. 8B, a display module DM-1 may include a display panel DP-1, an input sensing unit ISP-1, and a coupling member SLM.

The display panel DP-1 may include a first substrate BS1, a circuit layer ML-D, and a display element layer EML. The input sensing unit ISP-1 may include a second substrate BS2 and a sensing circuit layer ML-T.

Each of the first substrate BS1 and the second substrate BS2 may be a silicon substrate, a plastic substrate, a glass substrate, an insulation film, or a laminated structure including a plurality of insulation layers. The first substrate BS1 may be a display substrate on which a circuit layer, a display layer, and the like are disposed.

The second substrate BS2 may be disposed on the display element layer EML. The second substrate BS2 may be an encapsulation substrate which encapsulates the display panel DP-1. Between the second substrate BS2 and the display element layer EML, a predetermined space may be defined. The space may be filled with air or inert gas. In addition, in an embodiment of the present invention, the space may be filled with a filler such as a silicone-based polymer, an epoxy-based resin, or an acrylic resin. However, the present invention is not limited thereto. There may be no space defined between the display element layer EML and the second substrate BS2, and the display element layer EML and the second substrate BS2 may be in contact with each other.

The sensing circuit layer ML-T may be disposed on the second substrate BS2.

Between the first substrate BS1 and the second substrate BS2, the coupling member SLM may be disposed. The coupling member SLM may couple the first substrate BS1 and the second substrate BS2. The coupling member SLM may include an organic matter such as a photo-curable resin or a photo-plastic resin, or an inorganic matter such as frit seal, but is not limited to any one embodiment.

Figure 9:
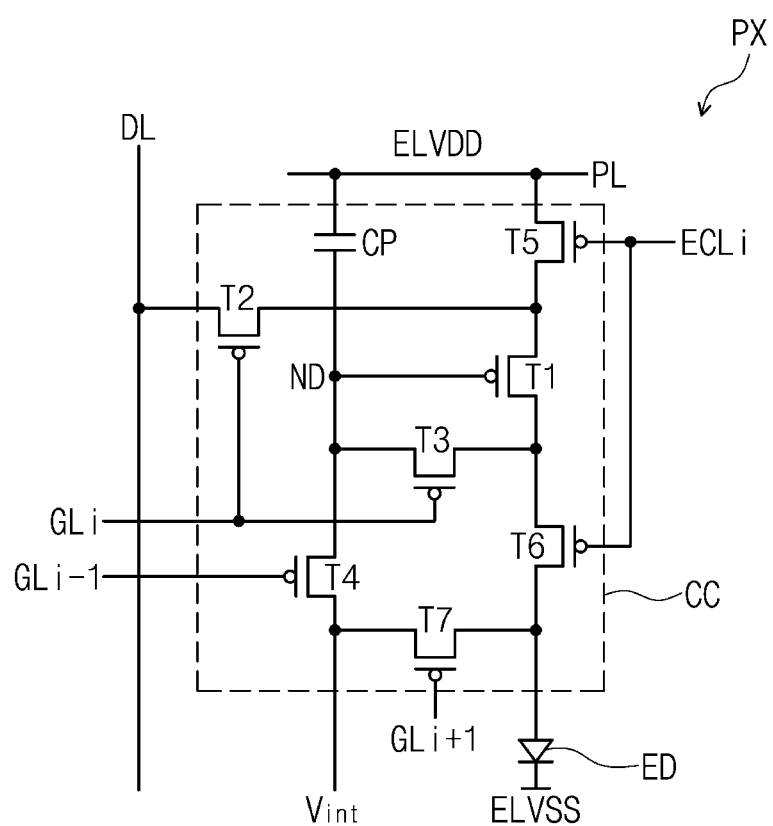
FIG. 9 is an equivalent circuit diagram of a pixel according to an embodiment of the present invention.

FIG. 9 is an equivalent circuit diagram of a pixel according to an embodiment of the present invention.

Referring to FIG. 9, an enlarged signal circuit diagram of one pixel PX among the plurality of pixels is exemplarily illustrated. FIG. 9 exemplarily illustrates the pixel PX connected to an i-th scan line GLi and an i-th light emission control line ECLi.

The pixel PX may include a light emitting element ED and a pixel circuit CC.

The pixel circuit CC may include the plurality of transistors T1 to T7 and a capacitor CP. The plurality of transistors T1 to T7 may be formed through a low temperature polycrystalline silicon (LTPS) process or a low temperature polycrystalline oxide (LTPO) process.

The pixel circuit CC controls the amount of current flowing through the light emitting element ED in correspondence to a data signal. The light emitting element ED may emit light to a predetermined luminance in correspondence to an amount of current provided from the pixel circuit CC. To this end, the level of the first power voltage ELVDD may be set to be higher than the level of the second power voltage ELVSS. The light emitting element ED may include an organic light emitting element or a quantum dot light emitting element.

Each of the plurality of transistors T1 to T7 may include an input electrode (or a source electrode), an output electrode (or a drain electrode), and a control electrode (or a gate electrode). In the present disclosure, any one of the input electrode and the output electrode may be referred to as a first electrode, and the other one thereof may be referred to as a second electrode for convenience.

The first electrode of a first transistor T1 is connected to the first power voltage ELVDD via a fifth transistor T5, and the second electrode of the first transistor T1 is connected to an anode electrode of the light emitting element ED via a sixth transistor T6. The first transistor T1 may be referred to as a driving transistor in the present disclosure.

The first transistor T1 controls the amount of current flowing through the light emitting element ED in correspondence to a voltage applied to the control electrode of the first transistor T1.

A second transistor T2 is connected between a data line DL and the first electrode of the first transistor T1. In addition, the control electrode of the second transistor T2 is connected to the i-th scan line GLi. The second transistor T2 is turned on when an i-th scan signal is provided to the i-th scan line GLi, and electrically connects the data line DL and the first electrode of the first transistor T1.

A third transistor T3 is connected between the second electrode of the first transistor T1 and the control electrode of the first transistor T1. The control electrode of the third transistor T3 is connected to the i-th scan line GLi. The third transistor T3 is turned on when the i-th scan signal is provided to the i-th scan line GLi, and electrically connects the second electrode of the first transistor T1 and the control electrode of the first transistor T1. Accordingly, when the third transistor T3 is turned on, the first transistor T1 is connected in the form of a diode.

A fourth transistor T4 is connected between a node ND and an initialization power generating unit (not shown). In addition, the control electrode of the fourth transistor T4 is connected to an i−1-th scan line GLi-1. The fourth transistor T4 is turned on when an i−1-th scan signal is provided to the i−1-th scan line GLi-1, and provides an initialization voltage Vint to the node ND.

The fifth transistor T5 is connected between the power line PL and the first electrode of the first transistor T1. The control electrode of the fifth transistor T5 is connected to the i-th light emission control line ECLi.

A sixth transistor T6 is connected between the second electrode of the first transistor T1 and the anode electrode of the light emitting element ED. In addition, the control electrode of the sixth transistor T6 is connected to the i-th light emission control line ECLi.

A seventh transistor T7 is connected between the initialization power generating unit (not shown) and the anode of the light emitting element ED. In addition, the control electrode of the seventh transistor T7 is connected to an i+1-th scan line GLi+1. The seventh transistor T7 is turned on when an i+1-th scan signal is provided to the i+1-th scan line GLi+1, and provides the initialization voltage Vint to the anode of the light emitting element ED.

The seventh transistor T7 may increase black expression capability of the pixel PX. Specifically, when the seventh transistor T7 is turned on, a parasitic capacitor (not shown) of the light emitting element ED is discharged. Then, when black luminance is implemented, the light emitting element ED does not emit light due to a leakage current from the first transistor T1, and accordingly, the black expression capability may be increased.

Additionally, FIG. 9 illustrates the control electrode of the seventh transistor T7 being connected to the i+1-th scan line Gli+1, but the embodiment of the inventive concept is not limited thereto. In another embodiment of the inventive concept, the control electrode of the seventh transistor T7 may be connected to the i-th scan line GLi or the i−1-th scan line GLi−1.

The capacitor CP is disposed between the power line PL and the node ND. The capacitor CP stores a voltage corresponding to a data signal. When the fifth transistor T5 and the sixth transistor T6 are turned on in accordance with the voltage stored in the capacitor CP, the amount of current flowing in the first transistor T1 may be determined.

In the present invention, an equivalent circuit of the pixel PX is not limited to the equivalent circuit illustrated in FIG. 9. In another embodiment of the inventive concept, the pixel PX may be implemented in various forms to allow the light emitting element ED to emit light. Although FIG. 9 illustrates a PMOS as a reference, the embodiment of the inventive concept is not limited thereto. In another embodiment of the inventive concept, the pixel circuit CC may be composed of an NMOS. In yet another embodiment of the present invention, the pixel circuit CC may be composed of a combination of an NMOS and a PMOS.

Hereinafter, a method for manufacturing a display module according to an embodiment of the present invention will be described with reference to the accompanying drawings.

Figure 10:
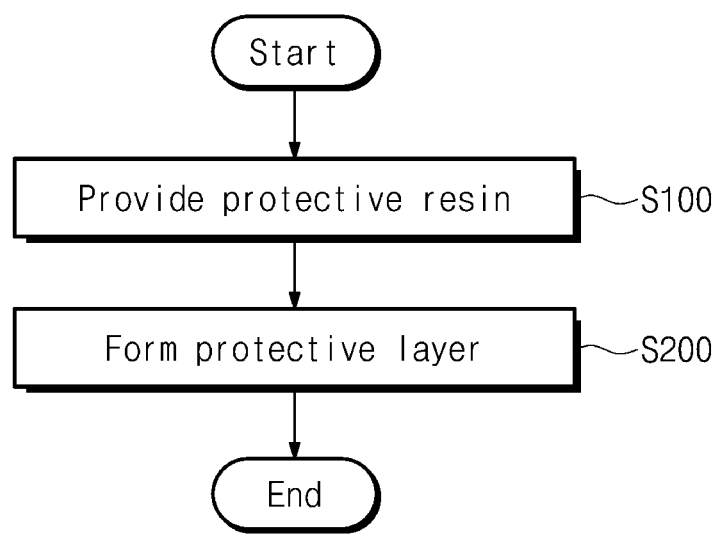
FIG. 10 is a flow chart showing steps of a method for manufacturing a display module according to an embodiment of the present invention.
Figure 11A:
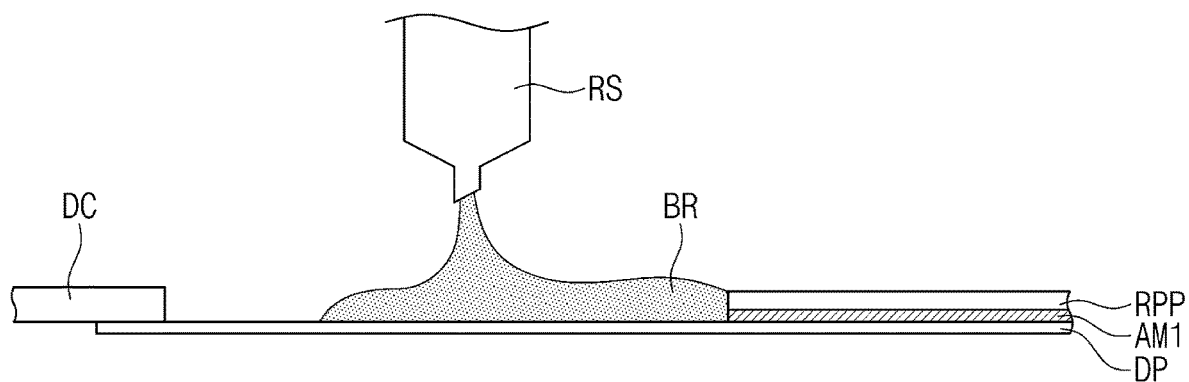
FIG. 11A to FIG. 11E are cross-sectional views sequentially showing each step of a method for manufacturing a display module according to an embodiment of the present invention.
Figure 11B:
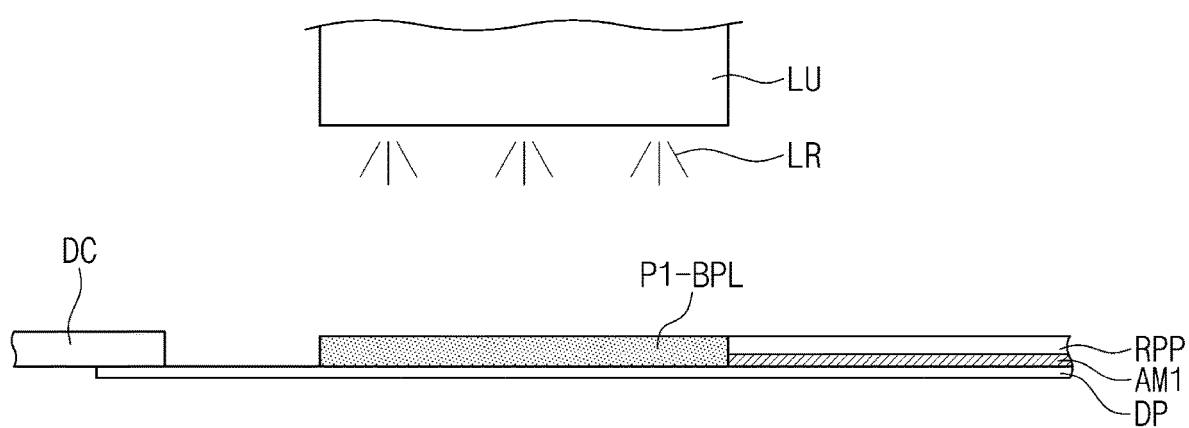
Figure 11C:
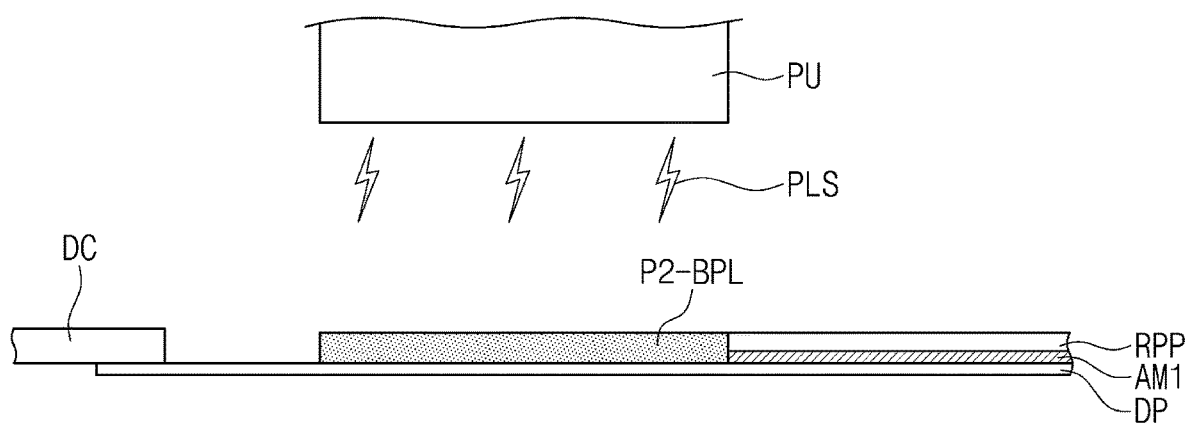
Figure 11D:
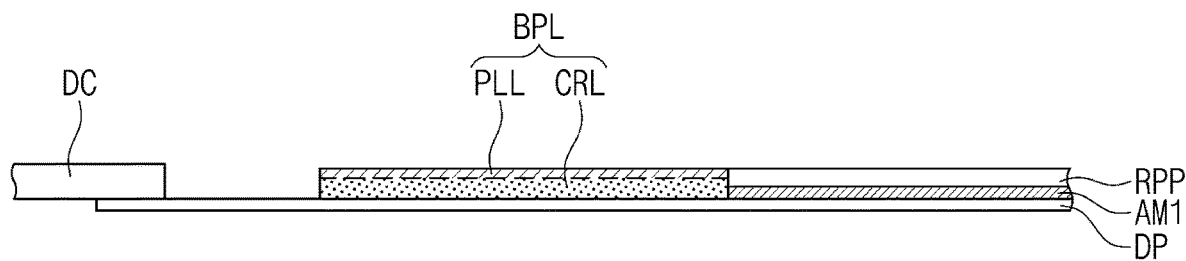
Figure 11E:
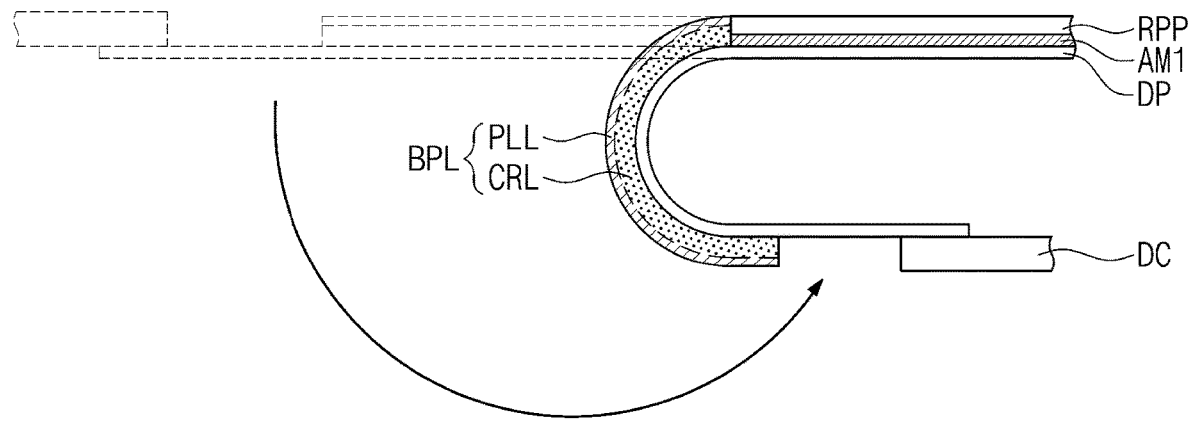
Figure 12A:
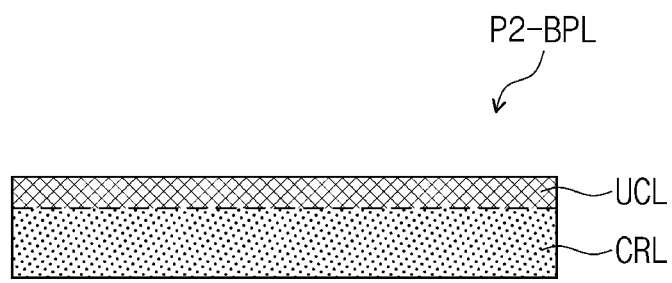
FIGS. 12A and 12B are cross-sectional views schematically showing some components of a method for manufacturing a display module according to an embodiment of the present invention.
Figure 12B:
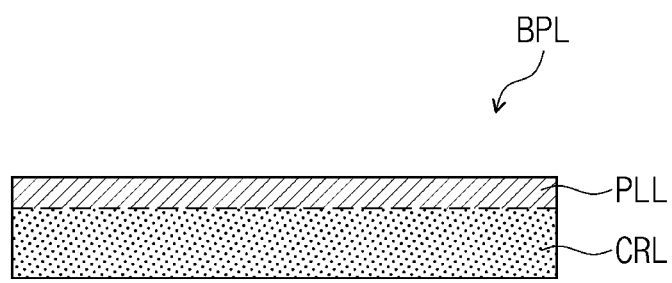

FIG. 10 is a flow chart showing steps of a method for manufacturing a display module according to an embodiment of the present invention. FIG. 11A to FIG. 11E are cross-sectional views sequentially showing each step of a method for manufacturing a display module according to an embodiment of the present invention. FIGS. 12A and 12B are cross-sectional views schematically showing some components of a method for manufacturing a display module according to an embodiment of the present invention. Hereinafter, in describing the method for manufacturing a display module according to an embodiment of the present invention with reference to FIG. 10, FIG. 11A to FIG. 11E, and FIG. 12A and FIG. 12B, the same reference numerals are given to components which are the same as those described above and detailed descriptions thereof will be omitted.

Referring to FIG. 10, the method for manufacturing a display module according to an embodiment of the present invention includes providing a protective resin on one side of a display panel (S100), and applying plasma on the protective resin to form a protective layer having a plasma processing layer formed on the surface thereof (S200).

Referring to FIG. 10 and FIG. 11A to FIG. 11E together, in the method for manufacturing a display module according to an embodiment, a protective resin BR is provided on one side of the display panel DP. The protective resin BR may be provided on the display panel DP through a supply nozzle RS. The protective resin BR may be provided by various methods. For example, the protective resin BR may be provided on the display panel DP by various methods such as jetting, slit coating, spin coating, transfer coating, or the like. FIG. 11A to FIG. 11E exemplarily illustrate providing the protective resin BR to a portion where the display panel DP is to be bent, that is, forming the bending portion protective layer BPL, but in the method for manufacturing a display module according to an embodiment, the protective resin may be provided to a connection portion of the display panel DP and the circuit board DC, thereby forming the connection portion protective layer CPL (FIG. 5A).

The protective layer BR may include an acrylic monomer, or a thiol-based monomer. The protective resin BR may include a monomer including a chain portion and a functional group portion, and a polymer chain may be formed by the formation of cross-links between monomers included in the protective resin BR during a cured process and a plasma processing process later.

In a preliminary protective layer P1-BPL formed by providing the protective resin BR, a process of curing by primarily providing light or heat may be performed. In an embodiment, light LR of a first wavelength region emitted from external light source LU may be provided to the preliminary protective layer P1-BPL to form a secondary preliminary protective layer P2-BPL. As the light LR of a first wavelength region is provided, a plurality of monomers included in the protective resin BR are polymerized, thereby curing the protective resin BR. The light LR of a first wavelength region provided from the external light source LU may be ultraviolet light. The ultraviolet light may be ultraviolet light having a center wavelength of about 345 nm.

After the secondary preliminary protective layer P2-BPL is formed according to the curing process, plasma PLS may be applied on the secondary preliminary protective layer P2-BPL through a plasma device PU, thereby forming a plasma processing layer PLL. The plasma processing layer PLL may be formed on the outer periphery portion of the bending portion protective layer BPL through a processing process of the plasma PLS. As a result of the plasma PLS processing process, the bending portion protective layer BPL on which the base curing layer CRL and the plasma processing layer PLL are sequentially stacked may be formed.

In the method for manufacturing a display module according to an embodiment, after the bending portion protective layer BPL is formed, a step of bending the display panel DP along the bending axis BX (see FIG. 5A) to have a predetermined radius of curvature may be further included.

Referring to FIG. 11A to FIG. 11E, and FIG. 12A and FIG. 12B together, in the method for manufacturing a display module according to an embodiment, the secondary preliminary protective layer P2-BPL formed after the curing process may include the base curing layer CRL and an uncured layer UCL formed on the upper portion of the base curing layer CRL. When the protective resin BR provided to the display panel DP is cured through photo-curing and the like, radicals generated by light are removed by oxygen and the like in the atmosphere, thereby inhibiting the reaction, and thus, the uncured layer UCL may be formed. Some of the monomers included in the protective resin BR may not be polymerized by the curing process, and may be included in the state of unreacted monomers or oligomers in the uncured layer UCL. In an embodiment, 80%6 to 95% of the monomers included in the protective resin BR are polymerized to form a polymer chain through the photo-curing, but 10% to 15% of the monomers may not be polymerized and included in the uncured layer UCL.

In the method for manufacturing a display module according to an embodiment, the uncured layer UCL formed after the curing reaction may be plasma PLS processed to form the plasma processing layer PLL In an embodiment, the base curing layer CRL of the bending portion protective layer BPL may be formed through a curing process in the step of providing the light LR, and the plasma processing layer PLL may be formed through a plasma processing process thereafter.

In the method for manufacturing a display module according to an embodiment, a plasma processing layer which has been formed through plasma processing is formed on the outermost periphery of a protective layer formed at a bending portion or a connection portion. When a polymer resin including an acrylic polymer or a thiol-based polymer is photo-cured or thermal-cured, the curing reaction may be inhibited due to oxygen and the like in the atmosphere, so that an unreacted monomer may be formed, and the unreacted monomer may be present as an uncured layer on the surface to cause process defects such as out-gassing in a subsequent heat treatment process, or the unreacted monomer may penetrate into the protective layer to cause chemical cracks, and the like. However, in the method for manufacturing a display module according to an embodiment of the present invention, a plasma processing layer in which the unreacted monomer is further reacted by plasma processing is formed, so that the process reliability of a display module is increased, and a display module with increased durability may be manufactured.

Figure 13A:
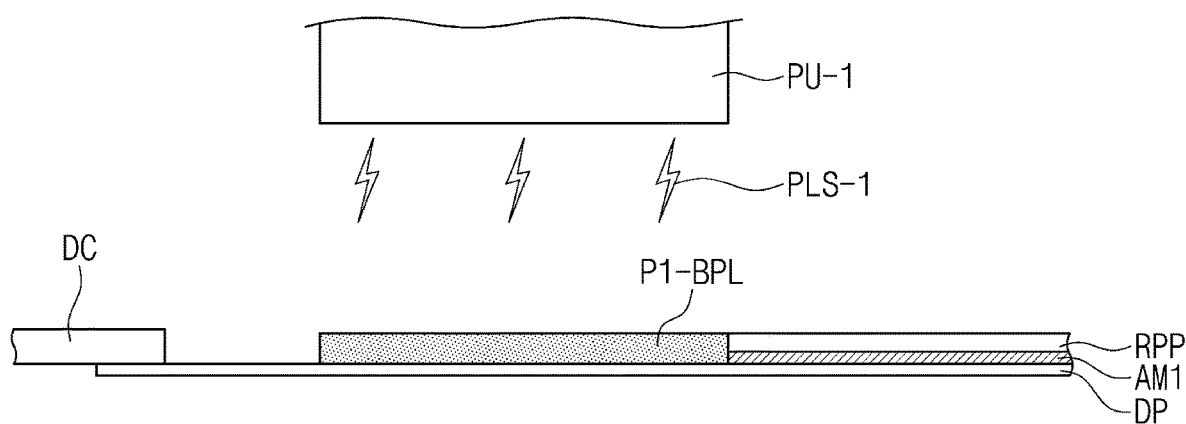
FIGS. 13A and 13B are cross-sectional views schematically showing some steps of a method for manufacturing a display module according to an embodiment of the present invention.
Figure 13B:
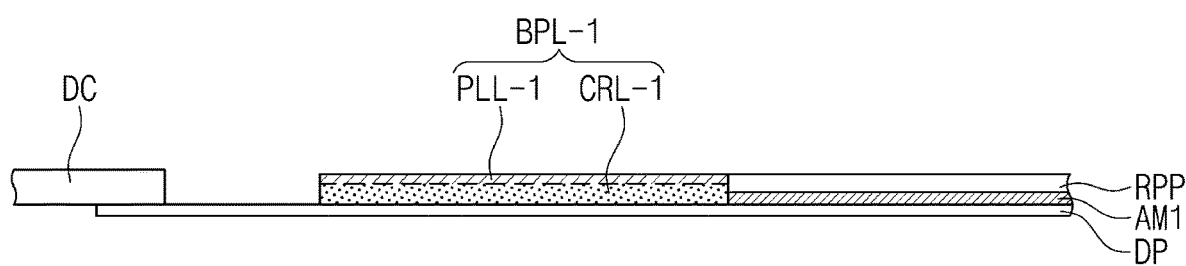

FIGS. 13A and 13B are cross-sectional views schematically showing some steps of a method for manufacturing a display module according to another embodiment of the present invention. FIG. 13A and FIG. 13B schematically show a process after the preliminary protective layer P1-BPL is formed. Hereinafter, in describing a method for manufacturing a display module according to an embodiment of the present invention with reference to FIG. 13A and FIG. 13B, the same reference numerals are given to components which are the same as those described above and detailed descriptions thereof will be omitted.

In the method for manufacturing a display module according to an embodiment of the present invention, a curing process may be omitted, and a plasma PLS-1 processing process may be formed on the preliminary protective layer P1-BPL formed by providing a protective resin. Through the plasma PLS-1 processing, a plasma processing layer PLL-1 may be formed on the outermost periphery of a bending portion protective layer BPL-1, and the protective resin inside may be cured by ultraviolet light and the like generated in the plasma PLS-1 processing process to form a base curing layer CRL-1. At this time, as the outermost plasma processing layer PLL-1 is first formed by the plasma PLS-1, and then the protective resin inside is cured to form the base curing layer CRL-1, a groove may be formed on the bending portion protective layer BPL-1. The bending portion protective layer BPL-1 having the groove formed on the surface thereof may be applied to a bending portion, thereby having a bending resistance due to a groove structure.

As a protective resin applied to a bending portion of a display module, an ultraviolet curing-type resin is used in consideration of need in a process. However, when an acrylic resin and the like are cured in the atmosphere, the curing reaction may be inhibited by dissolved oxygen, thereby generating an uncured layer. Therefore, the present invention provides a display module with increased reliability and durability by preventing the occurrence of an uncured layer in a protective resin through plasma processing.

Although the inventive concept has been described with reference to embodiments of the inventive concept, it will be understood by those skilled in the art that various changes in form and details may be made therein without departing from the spirit and scope of the inventive concept as set forth in the following claims.

Accordingly, the technical scope of embodiments of the inventive concept is not intended to be limited to the contents set forth in the detailed description of the specification.

The invention claimed is:

1. A display module comprising:
a display panel including a flat region, and a bending region adjacent to the flat region;
a protective layer disposed on at least one side of the display panel; and
a circuit board connected to one end of the display panel, wherein at least a portion of the circuit board is disposed to face the flat region of the display panel, and
wherein the protective layer includes:
a base curing layer disposed on the display panel; and
a plasma processing layer disposed on the base curing layer,
wherein the protective layer is disposed on at least one of the bending region or a connection portion of the circuit board and the display panel,
wherein the protective layer comprises a monomer including a plurality of chain portions and a plurality of functional group portions,
wherein the plasma processing layer comprises a first polymer chain and a second polymer chain that are formed by connecting the plurality of chain portions of the monomer, wherein at least one of the plurality of functional group portions included in the first polymer chain is cross-linked to the second polymer chain, and
wherein the base curing layer comprises a first base polymer chain and a second base polymer chain that are formed by connecting the plurality of chain portions of the monomer, wherein the first base polymer chain and the second base polymer chain are not cross-linked to each other.

2. The display module of claim 1, wherein the protective layer comprises an acrylic polymer or a thiol-based polymer.

3. The display module of claim 1, wherein the protective layer overlaps the bending region.

4. The display module of claim 1, wherein the display panel further comprises an opposing region adjacent to the bending region, the opposing region faces the flat region when the bending region is in a bent configuration.

5. The display module of claim 1, wherein:
the display panel and the circuit board are connected to each other at the connection portion; and
the protective layer is disposed in the connection portion.

6. The display module of claim 1, wherein:
the display panel comprises a base layer, a circuit layer disposed on the base layer, a plurality of display elements disposed on the circuit layer and generating light, and an encapsulation layer covering the plurality of display elements; and
the display module further comprises an input sensing layer disposed on the encapsulation layer.

7. A display module comprising:
a display panel including a flat region, a bending region adjacent to the flat region, and an opposing region adjacent to the bending region and facing the flat region when the bending region is in a bent configuration; and
a protective layer disposed on the bending region, wherein the protective layer includes a plasma processing layer disposed at an uppermost portion of the protective layer,
wherein the protective layer comprises a monomer including a plurality of chain portions and a plurality of functional group portions,
wherein the plasma processing layer comprise s a first polymer chain and a second polymer chain that are formed by connecting the plurality of chain portions of the monomer, wherein at least one of the plurality of functional group portions included in the first polymer chain is cross-linked to the second polymer chain, and wherein the base curing layer comprises a first base polymer chain and a second base polymer chain that are formed by connecting the plurality of chain portions of the monomer, wherein the first base polymer chain and the second base polymer chain are not cross-linked to each other.

8. A method for manufacturing a display module including a display panel having a flat region and a bending region adjacent to the flat region and a circuit board connected to one end of the display panel, the method comprising:
providing a protective resin on at least one side of the display panel; and
applying plasma on the protective resin to form a protective layer having a plasma processing layer on a surface of the protective layer, and
wherein in the step of providing the protective resin, the protective resin is provided on at least one of the bending region of the display panel or a connection portion of the display panel and the circuit board,
wherein in the step of applying plasma on the protective resin, the plasma treatment layer is formed on top of the protective layer, and a base curing layer is formed below the plasma treatment layer,
wherein the protective resin comprises a monomer including a plurality of chain portions and a plurality of functional group portions,
wherein the plasma processing layer comprises a first polymer chain and a second polymer chain that are formed by connecting the plurality of chain portions of the monomer, wherein in the applying of plasma, at least one of the plurality of functional group portions included in the first polymer chain is cross-linked to the second polymer chain, and wherein the base curing layer comprises base polymer chain and a second base polymer chain that are formed by connecting the plurality of chain portions of the monomer, wherein the first base polymer chain and the second base polymer chain are not cross-linked to each other.

9. The method of claim 8, wherein the forming of the protective layer comprises:
irradiating light on the protective resin to form a preliminary protective layer; and
applying the plasma on the preliminary protective layer to form the plasma processing layer.

10. The method of claim 8, wherein the forming of the protective layer includes:
forming a base curing layer on the display panel; and
forming the plasma processing layer on the base curing layer by applying the plasma on an uncured portion of the base curing layer.

11. The method of claim 8, wherein the protective resin is provided on the bending region of the display panel.

12. The method of claim 8, wherein:
the display panel and the circuit board are connected to each other at the connection portion; and
the protective resin is provided in the connection portion.

13. The method of claim 8, wherein the protective resin comprises an acrylic monomer or a thiol-based monomer.

14. The method of claim 8, wherein:
the providing of the protective resin and the forming of the protective layer are performed in a state in which the display module is flat; and
the method further comprises bending the display module after the forming of the protective layer.

* * * * *